United States Patent

Rouchaud

[11] Patent Number: 5,821,640
[45] Date of Patent: Oct. 13, 1998

[54] ELECTRICAL SWITCHING ASSEMBLY

[75] Inventor: Gilles Rouchaud, Montmirail, France

[73] Assignee: Axon' Cable, S.A., Montmirail, France

[21] Appl. No.: 640,757
[22] PCT Filed: Nov. 18, 1994
[86] PCT No.: PCT/FR94/01350
§ 371 Date: May 7, 1996
§ 102(e) Date: May 7, 1996
[87] PCT Pub. No.: WO95/14333
PCT Pub. Date: May 26, 1995

[30] Foreign Application Priority Data

Nov. 18, 1993 [FR] France ................................ 93 13776

[51] Int. Cl.$^6$ .............................................. G01R 15/12
[52] U.S. Cl. .................... 307/115; 307/113; 307/125;
324/500; 324/538; 395/27; 327/401
[58] Field of Search ................................ 307/115, 113,
307/125; 327/369, 401; 324/500, 538; 395/27;
364/757

[56] References Cited

U.S. PATENT DOCUMENTS

| 3,535,526 | 10/1970 | Henry et al. ........................ 250/209 |
| 3,721,899 | 3/1973 | Haywood ............................ 324/73 |
| 4,723,269 | 2/1988 | Summerlin ......................... 379/102 |
| 4,924,831 | 5/1990 | Piteo et al. ......................... 123/417 |
| 5,212,587 | 5/1993 | Healey ................................ 359/301 |

FOREIGN PATENT DOCUMENTS 2 253 329   7/1975   France .

OTHER PUBLICATIONS

European Search Report from European patent application PCT/FR94/01350, filed Nov. 18, 1994.
For Multiplexing Applications, Photovoltaic Relays Fill the Bill Handily, Shawn Fogarty Jr., Electronic Design, Pips Special Editorial Feature, Dec. 13, 1990.
High–Speed 8:1 Multiplexer and 1:8 Demultiplexer Implemented With AlGaAs/GaAs HBT's, Nubling et al., IEEE Journal of Solid–State Circuits, vol. 26, No. 10, Oct. 1991.
Design of Submicrometer CMOS Differential Pass–Transistor Logic Circuits, Pasternak et al., IEEE Journal Solid–State Circuits, vol. 26, No. 9, Sep. 1991.

Primary Examiner—William M. Shoop, Jr.
Assistant Examiner—Albert W. Paladini
Attorney, Agent, or Firm—Wolf, Greenfield & Sacks, P.C.

[57] ABSTRACT

The invention relates to switching apparatus having a pair of input terminals (102, 104) and $2^P$ pairs of output terminals (106a, 106b). The switch comprises p rows of switches $K_{i,j}$ with the ith row having $2^i$ unit switches. It also comprises a control circuit (108) which enables the state of all the switches in a given row to be controlled together, thereby enabling the pair of input terminals to be connected to any pair of output terminals.

6 Claims, 4 Drawing Sheets

FIG_2

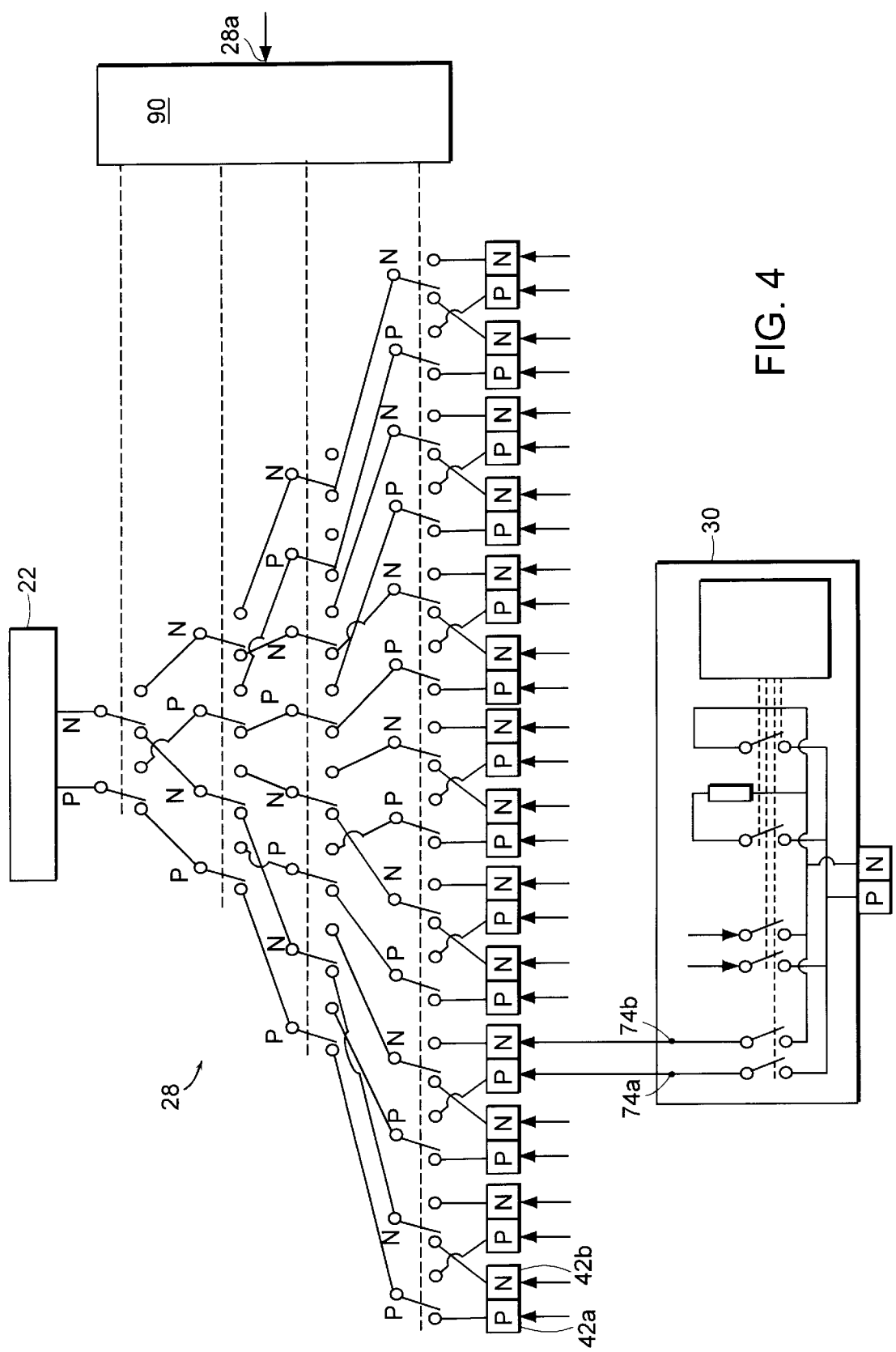

ELECTRICAL SWITCHING ASSEMBLY

The present invention relates to an electrical switching assembly.

More precisely, the invention relates to controllable apparatus enabling a pair of input terminals to the switching apparatus to be selectively connected to any one of n pairs of output terminals of the switching apparatus.

There exist numerous occasions on which it is useful to have such an electrical switching assembly available. This applies in particular for automatic electrical test apparatus for determining and verifying the electrical transmission properties between various electrical components which are connected to a main line via branch lines coupled to the main line by couplers. A certain number of electrical installations are to be found having various electronic or electrical components, in particular as constituted by sensors or actuators, that interchange data via a single main line, with this type of connection usually being called a "bus" or a "harness/bus". This disposition is to be found, in particular, in electrical circuits of the kind installed, for example, in space rockets for interconnecting the various sensors or actuators of the rocket. Given the cost of such a rocket and of launching it, it is clearly of great importance for the electrical connection members between its various components to be capable of being fully tested prior to being installed in the rocket or in any similar installation in order to avoid risks of breakdown or faulty operation.

In the special case of space installations, this type of "harness/bus" interconnection must satisfy the standard: MIL-STD-1553B. However, for other types of installation, it is necessary to verify that interconnections comply with standards of the same type.

In general, the various interconnection systems must be tested in different configurations, i.e., in succession, when each of the components connected by branch lines behaves as a sender, when it behaves as a receiver, when an input load is applied thereto to simulate a card, i.e. an electronic circuit, and possibly when one of the receivers or senders referred to below as a "subscriber" is short circuit or open circuit to simulate damage to the installation as a whole in order to test its behavior in such a configuration.

It will easily be understood that when the harness/bus is used to interconnect a large number of components, e.g. about ten, the number of different configurations to be tested in order to be sure that each branch line is properly coupled to the main line is extremely high.

With the means used at present, which are means that are essentially manual and not automatic, the time that would be required for testing all configurations properly becomes prohibitive. Consequently, only a limited number of critical configurations are actually tested. It will be understood, that although such a test procedure is statistically capable of detecting breakdowns or damage of the kind that is the most frequent, it is incapable of ensuring that the interconnection installation will operate properly in all of its possible configurations.

As already briefly outlined, when this system of interconnections and the quality of its operation are critical points for the operation of a rocket or similar equipment where cost is very high, it is advantageous to ascertain in as complete a manner as possible that all of the electrical lines are operating properly before mounting the system in the rocket.

It will also be understood that such an electrical test installation is completely under the control of computer means. It is thus very important for the switching assembly to be convenient for control by computer instructions.

Finally, it can be seen that in order to obtain measurements that are very accurate and repetitive, it is important for the architecture of the switching assembly to avoid introducing interfering effects, and that it must not introduce variations in electrical characteristics depending on the particular electrical path defined through the switch for connecting the pair of input terminals to one of the m pairs of output terminals.

To achieve this object, according to the invention, the electrical switching assembly is characterized in that it comprises:

two external terminals forming said input of said switching assembly;

p rows of switches, row i having $2^i$ switches, each switch having an input terminal, first and second output terminals, and controllable electrical connection means for selectively connecting said input terminal to said first output terminal or to said second output terminal, each of said first and second output terminals of switches in row i being electrically connected to the input terminal of a respective switch in row i+1, the two external terminals being connected to respective input terminals of the two switches of the first row; and control means for controlling the controllable electrical connection means of all of the switches in the same row simultaneously in such a manner that for all of the switches of the same row, the input terminal is connected to the first output terminal or is connected to the second output terminal depending on binary control states;

each of the $2^P$ first output terminals and each of the $2^P$ second output terminals being connected to a respective one of the switching input or output terminals, and the first and second output terminals of the ith row being connected to the input terminals of the switches of the row in such a manner that for each combination of binary control states of the control means of the rows of switches, the two external terminals of said switching assembly can be connected to any one single pair of switching input or output terminals.

It will be understood that the switching assembly is constituted by a binary tree structure of sets of switches organized in rows. The states of the switches belonging to a given row are changed simultaneously and the ON state for each switch line enables the terminals external to the switching assembly to be electrically connected to a single pair of switching outlet or inlet terminals, said pairs of terminals themselves being connected to the branch line state circuits, i.e. to the "subscriber" cards. This tree structure makes it possible to simplify control of the switching assembly while still enabling the external input terminals to be connected in unique manner to the switching output terminals. This disposition also serves to shorten line length.

Other characteristics and advantages of the present invention appear more clearly on reading the following description of a preferred embodiment of the invention, given by way of non-limiting example. The description refers to the accompanying figures, in which:

FIG. 4 is a view similar to FIG. 3, but showing the switching assembly in receive mode.

Figure 1:
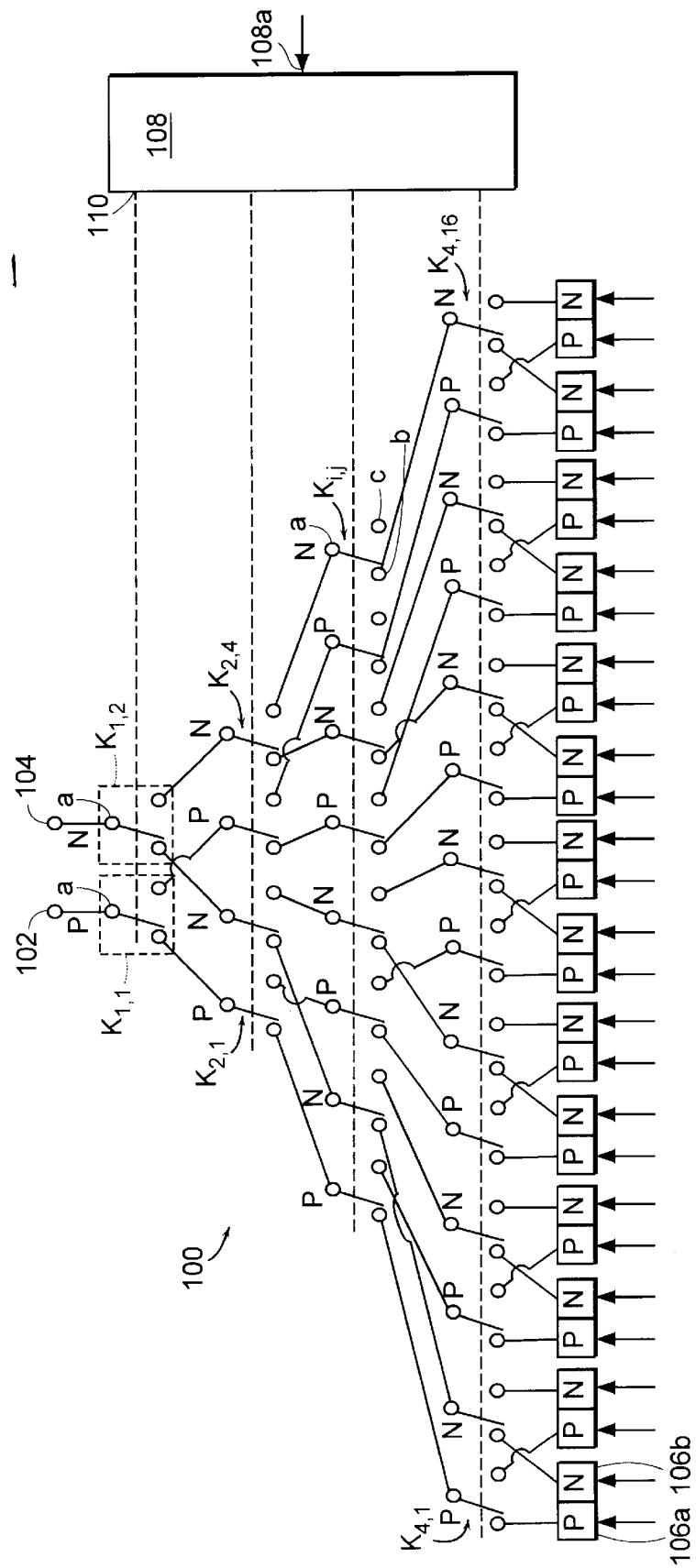
FIG. 1 is a diagram showing a switching assembly of the invention.

A preferred embodiment of a switching assembly is described initially with reference to FIG. 1.

The switching assembly 100 essentially comprises p rows of unit switches given generic reference K. The first row of switches is constituted by two unit switches $K_{1,1}$ and $K_{1,2}$ whose inputs are given generic reference a and are connected to respective input terminals 102 and 104 of the switching assembly. In generic manner, each switch $K_{i,j}$ has two output terminals given respective references b and c. The second row of the switch has four unit switches that are thus referenced $K_{2,1}$ to $K_{2,4}$. Each first output terminal b of a switch in row i is connected to the input terminal a of a respective switch in row i+1, and each output terminal c of a switch in row i is connected to the input a of a different respective switch in line i+1. A switch tree structure is thus obtained, with each row i having twice as many switches as row i–1. More generally, row i of unit switches $K_{i,j}$ has $2^i$ switches. In the example under consideration, the switching assembly has four rows of unit switches, which means that the fourth row has $2^4$ unit switches referenced $K_{4,1}$ to $K_{4,16}$. The outputs b and c of the unit switches K of the last row are respectively connected to positive external output terminals 106a of the switching assembly and to negative terminals 106b of the switching assembly.

As can also be seen in FIG. 1, the switch has a control unit 108 having as many control outputs 110 as there are lines of unit switches, i.e. four in the example under consideration. Each output 110 of the control apparatus 108 serves to cause the inputs a of the unit switches in the same row to be connected simultaneously to the output terminals b or simultaneously to the output terminals c. A full control instruction for the switch 100 thus comprises four binary digits indicating whether the unit switches K of a row i should be in a position that connects their inputs a to their terminals c or in a position that connects their inputs a to their terminals b.

The electrical connections between the outputs b and c of the unit switches $K_i$ of row i and the terminals a of the switches $K_{i+1}$ of row i+1 are such that the inputs 102 & 104 of the switching assembly can be connected to any one of the pairs of external output terminals of the switch 106a & 106b, and to one pair only. FIG. 1 shows a possible configuration for said electrical connections.

In other words, when a control signal is applied to the control input 108a of the control apparatus 108 of the switch 100, the unit switches of the various rows take up a state enabling the input 102 & 104 to be connected to the selected pair of external output terminals 106a & 106b.

The unit double-pole switches K can be of any kind. Similarly, the moving contact control means of the switches which are represented in FIG. 1 merely by dashed lines can be of any kind. In particular, it is possible to use relays whose states are controlled by means of opto-couplers.

The tree structure of the switching assembly 100 presents numerous advantages. Switching control is simplified since it suffices to provide p binary digits to connect the external terminals connected to the signal generator or to the measuring device to a selected one of the $2^p$ pairs of terminals connected to the "subscriber" cards. Also, each electrical path defined between the input pair of terminals and any one of the output terminals has the same number of intermediate contacts, thereby ensuring the same electrical conduction qualities regardless of path, with the path lengths also being all substantially equal. In addition, for each position of the unit switches, they define only two electrical paths that do indeed extend from the input terminals to one pair of output terminals, and no partial paths are defined as seen from the input terminals, thereby avoiding interfering phenomena which could be induced by partial paths connected to the input terminals.

An entire apparatus for electrically testing the harness/bus and making use of the switch of FIG. 1 is described below with reference to FIG. 2.

Figure 2:
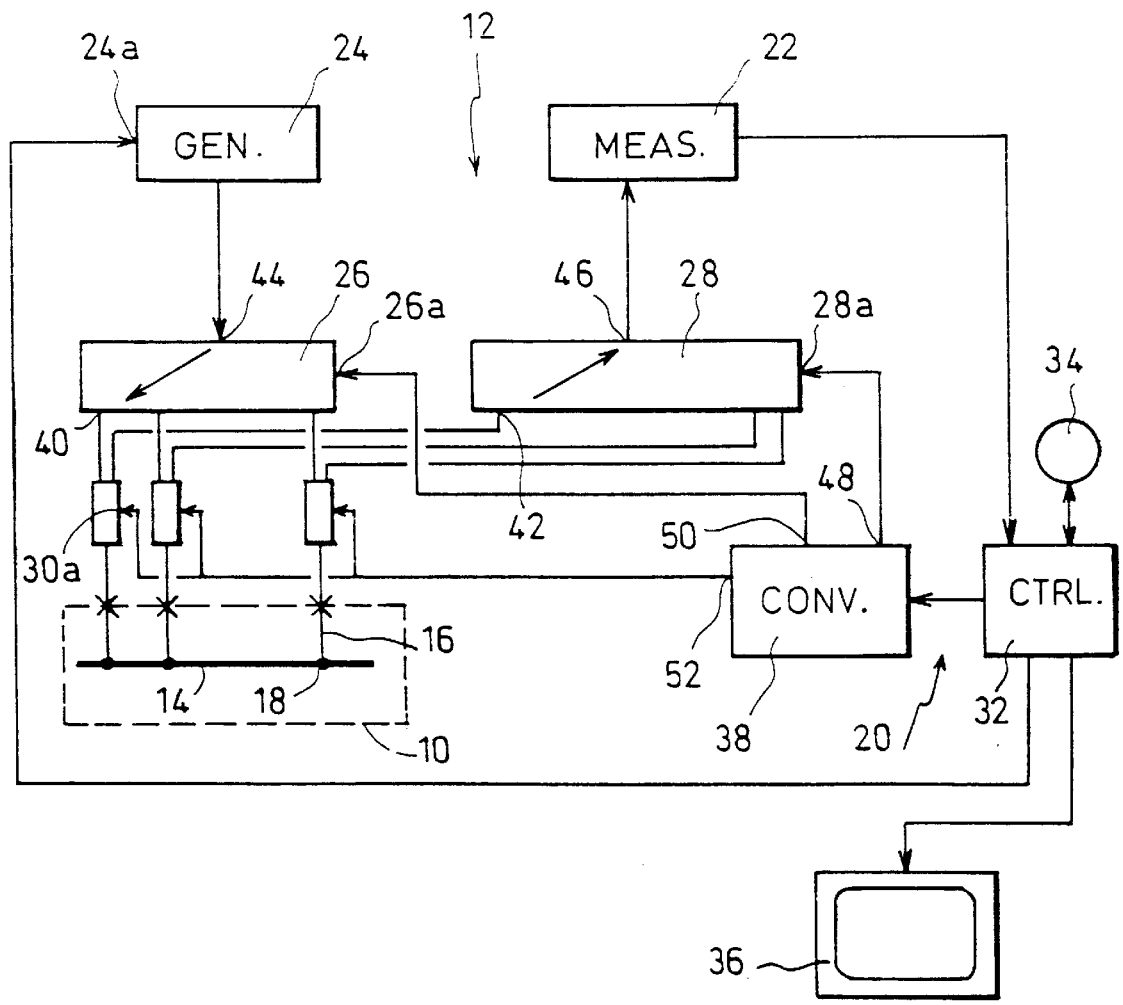
FIG. 2 is a block diagram of the electrical test apparatus a whole.

In FIG. 2, a bus 10 to be tested is shown connected to the test apparatus 12. The bus 10 is constituted by a main line 14 having n branch lines 16 connected thereto. Each branch line 16 is connected to the main line 14 by an electrical coupler 18.

The electrical test apparatus is essentially constituted by a control unit 20 for applying and controlling the battery of tests to which the bus 10 is to be subjected, an electrical measuring device 22 such as an oscilloscope or a recorder, a controllable electrical signal generator 24, first and second electrical switches respectively referenced 26 and 28, and m branch line state circuits given overall reference and referred to below for simplification purposes as "subscriber" cards.

The switches 26 and 28 have the architecture described with reference to FIG. 1.

The control unit 20 essentially comprises a computer machine 32 associated with a program memory 34 which enables the various configurations of tests to be applied to the bus 10 to be run. The computer apparatus 32 is preferably associated with means 36 for display purposes and for printing results. The computer control apparatus 32 is also coupled to a converter 38 which serves to convert the instructions issued by the computer apparatus 32 into executable control signals enabling the states of the various components of the test apparatus 12 to be controlled. The computer control apparatus 32 is also connected to the control input 24a of the electrical signal generator 24 in order to define the form of the electrical signal which is to be applied for the test stage under consideration.

More precisely, as shown in FIG. 2, each branch line 16 of the bus 10 is connected to the input and/or the output of a "subscriber" card 30. Each "subscriber" card 30 is connected to an output 40 of the first switch 26 and to an input 42 of the second switch 28. The input 44 of the switch 26 is connected to the output of the electrical signal generator 24, while the output 46 of the second switch 28 is connected to the input of the electrical measuring apparatus 22. The converter 38 has a first output 48 which is connected to the control input 28a of the switch 28 and a second control output 50 which is connected to the control input 26a of the first switch 26.

As explained in greater detail below with reference to FIGS. 3 and 4, the switch 26 enables its input 44 to be connected to one of the outputs 40 of said switch and thus to one of the m "subscriber" cards 30. Similarly, the switch 28 serves to connect one of its inputs 42, i.e. one of the "subscriber" cards 30, to its own output 46, i.e. to the measuring device 22. The conversion apparatus 38 includes a third control output 52 which is applied to the control input 30a of each of the "subscriber" cards 30. The converter can use its output 52 to apply a control signal to each "subscriber" card serving, as explained in greater detail below, to define the state of each of the branch lines 16 during a test stage. Depending on which control signal is applied to the inputs 30a of the "subscriber" cards 30. Each subscriber card can connect the branch line with which it is associated to the electrical signal generator 24 or to the measuring device 22, or to neither of them. Under such circumstances, the control signal can put the "subscriber" card in a state that corresponds to short circuiting the corresponding branch line 16 or that represents the nominal operating load applied thereto.

The way in which the electrical test apparatus 12 of FIGS. 2 to 4 operates is described below. For each step in a series of tests, one branch line sends, one branch line receives, and the other branch lines are either short circuited to simulate a breakdown, or open circuit, or else connected to their normal loads. Implementing the test step thus consists in the program 34 defining the number of the sending branch line 16, the number of the receiving branch line 16, and the state of each of the other branch lines. It is also necessary to define data specifying the characteristics of the signal that is to be sent by the sending branch line and possibly also the nature of the measurements to be performed.

These various items of information are transmitted to the converter 38 which serves firstly to control the various "subscriber" cards 30 as a function of the state of the branch line associated therewith. More precisely, one of the "subscriber" cards is controlled to connect the branch line to the electrical signal generator 24 and another card is controlled to connect the "subscriber" card to the measuring device 22. The other "subscriber" cards are controlled to take up respective ones of the other possible states. Simultaneously, the converter 38 controls the switches 26 and 28 so that the sending "subscriber" card is indeed connected to the generator 24 and so that the receiving "subscriber" card is indeed connected to the measuring device 22. In addition, the electrical signal generator 24 is controlled to apply the desired form of electrical signal for the test. Once these various connections have been set up, the measuring device 22 performs the measurements of electrical characteristics as specified in the test, which measurements are transmitted to the computer apparatus 32 which enables them to be processed and possibly displayed on the display apparatus 36 or on a paper medium, or else to be stored on a computer medium.

It will be understood that the general organization of the test apparatus makes it possible in a relatively short length of time to cause each of the branch lines to act as a sender in combination successively with each of the other branch lines then acting as a receiver, and while combining these various states with the various configurations possible for the other branch lines that are acting neither as a sender nor as a receiver. Changeover from one configuration to another is controlled automatically by the computer program implemented by the computer apparatus 32 whose instructions are converted into electrical control signals by the converter 38.

Figure 3:
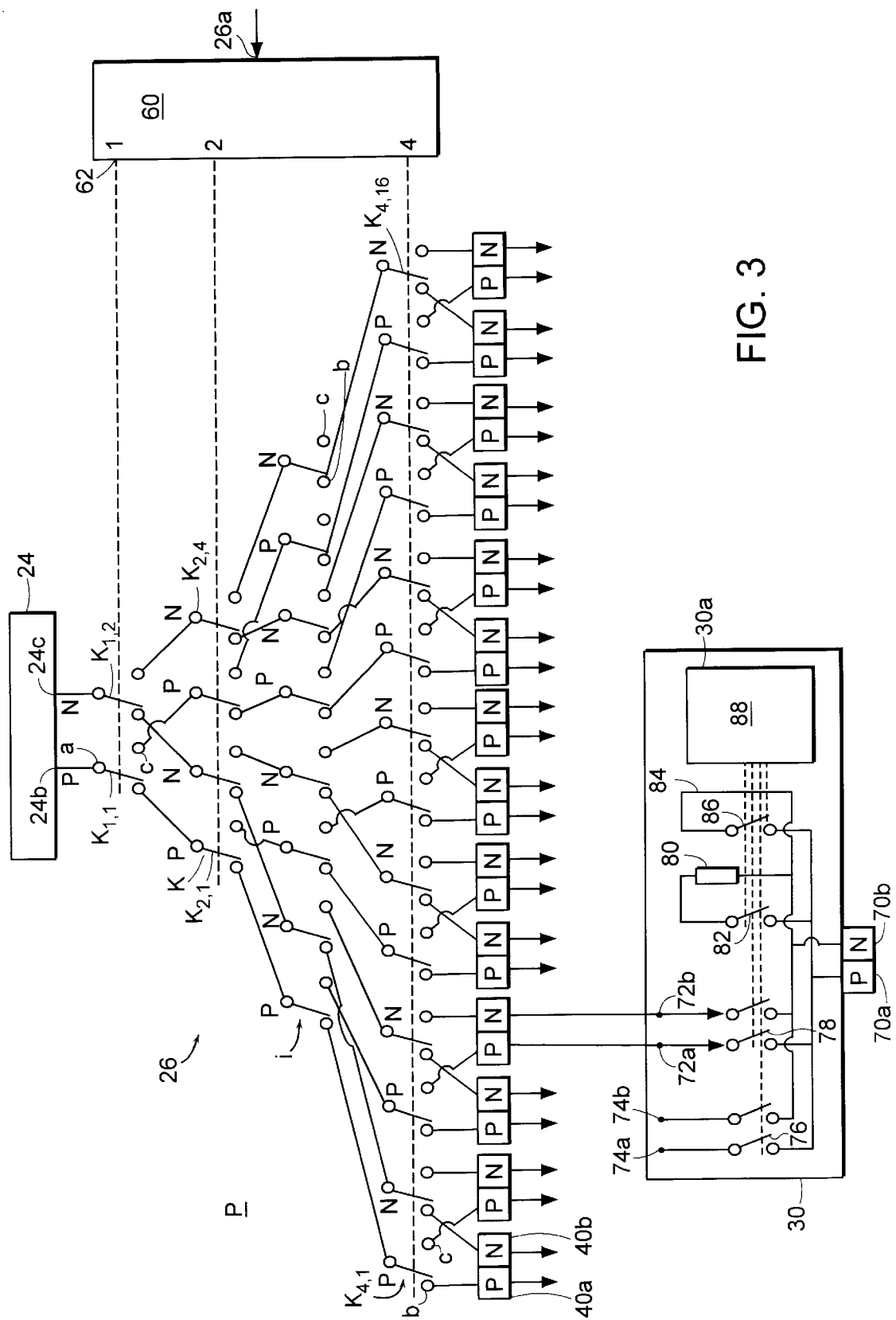
FIG. 3 is a diagram showing the switching assembly in send mode together with a "subscriber" card.

With reference now to FIG. 3, there follows a description of a preferred embodiment of the first switch 26 enabling the "subscriber" cards to be connected to the electrical signal generator 24, and also a preferred embodiment of a "subscriber" card 30. This switch has the structure described above.

The switch 26 is essentially constituted by p lines of unit switches given generic reference K. The first row of switches comprises two unit switches $K_{1,1}$ and $K_{1,2}$ whose inputs are given generic reference a and are connected to respective output terminals 24b & 24c of the generator 24. The outputs b and c of the unit switches K in the last row are connected respectively to the positive external output terminals 40a of the switch assembly and to the negative terminals 40b of the switch assembly.

As also shown in FIG. 3, the switch includes a control unit 60 having as many control outputs 62 as there are rows of unit switches, i.e. four in the example under consideration. Each output 62 from the control apparatus 60 serves to connect the a inputs of the unit switches in a given row simultaneously to the b output terminals or simultaneously to the c output terminals. A complete control instruction for the switch 26 thus comprises four binary digits indicating whether the switches of a corresponding row i are to be in a position that connects the a inputs to the b terminals or in a position which connects the a inputs to the c terminals.

The electrical links between the output terminals b and c of the unit switches $K_i$ in row i and the terminals a of the switches $K_{i+1}$ of row i+1 are such that the outputs 24b & 24c of the electrical generator 24 can be connected to any one of the pairs of external output terminals 40a & 40b of the switch 20, and to only one such pair. FIG. 2 shows one possible configuration for the electrical connections.

In other words, when a control signal is applied to the input 26a of the control apparatus 60 of the switch 26, the switches in the various rows take up respective states enabling the generator 24 to be connected to a selected pair of external output terminals 40a & 40b, i.e. enabling the generator 24 to be connected to a determined "subscriber" card 30.

Still with reference to FIG. 2, a preferred embodiment of a "subscriber" card 30 is described. It has a first input/output pair constituted by a positive terminal 70a and a negative terminal 70b. As already mentioned, the terminals 70a & 70b are connected to a branch line 16 of the bus 10 to be tested. The "subscriber" card includes a second pair of external connection terminals 72a & 72b for connection to a pair of external output terminals 40a & 40b of the switch 26. The card 30 also has a third pair of external terminals 74a & 74b for connection to the external input terminals of the switch 28, as explained below. Double-pole switches 76 and 78 serve to connect the terminals 70a & 70b respectively to the terminals 72a & 72b and 74a & 74b, or on the contrary to disconnect them therefrom. The terminals 70a & 70b can also be connected to a load 80 simulating the normal load which is to be applied to the branch line in non-sending and non-receiving operation, which connection can be established by a switch 82, or else it can simulate a short circuit which can be via conductor line 84 and a switch 86. The "subscriber" card also includes a control circuit 88 which enables the open or closed positions of the switches 76, 78, 82, and 86 to be controlled individually depending on the state in which the branch line associated with the "subscriber" card is to be placed. In other words, the control circuit 88 receives a series of instructions via the control input of the card 30a to cause one of its switches to be closed while the other three remain open.

FIG. 4 shows a preferred embodiment of the switch 28. This has exactly the same architecture as the switch 26. It should merely be understood that where there used to be external output terminals there are now external input terminals 42a & 42b of the switch for connecting each "subscriber" card 30 to the electrical measuring device 22. More precisely, as shown in FIG. 4, the terminals 74a & 74b of each "subscriber" card 30 are connected to the external input terminals 42a & 42b of the switch 28. The switch is controlled in rows by its control circuit 90 which receives instructions on an input 28a.

I claim:

1. A switching assembly comprising:

two external terminals adapted and arranged to receive or provide an electronic signal therebetween;

p rows of switches, row i having $2^i$ switches, each switch having an input terminal, first and second output terminals, and controllable electrical connection means for selectively coupling said input terminal to said first output terminal or to said second output terminal, each of said first and second output terminals of switches in row i being electrically coupled to the input terminal of a respective switch in row i+1, the two external terminals being coupled to respective input terminals of a pair of switches of the first row; and control means for controlling the controllable electrical connection means of all of the switches in the same row simultaneously in such a manner that for all of the switches of the same row, the input terminal is coupled to the first output terminal or is coupled to the second output terminal depending on binary control states;

each of the $2^P$ first output terminals and each of the $2^P$ second output terminals being coupled to a respective one of a plurality of switching input or output terminals, and the first and second output terminals of the ith row being coupled to the input terminals of the switches of the (i+1)th row in such a manner that for each combination of binary control states of the control means of the rows of switches, the two external terminals of said switching assembly can be coupled to any one single pair of the plurality of switching input or output terminals.

2. A switching assembly according to claim 1, wherein the switches are double-pole switches under the control of opto-couplers.

3. A switching assembly according to claim 1, wherein the two external terminals are adapted and arranged to interface interchangeably with circuitry external to the switching assembly.

4. A switching assembly according to claim 1, wherein each of the plurality of switching input or output terminals is adapted and arranged to interface interchangeably with circuitry external to the switching assembly.

5. A switching assembly, comprising:

a pair of external terminals adapted and arranged to receive or provide an electronic signal therebetween;

"p" rows of switches, row "i" having $2^i$ switches, each switch having, first and second output terminals, and an input terminal selectively coupled to said first output terminal or to said second output terminal, each of said first and second output terminals of switches in row "i" being electrically coupled to the input terminal of a respective switch in row i+1, the pair of external terminals being coupled to respective input terminals of switches of the first row; and a switch control circuit configured to control the switches in the same row simultaneously in such a manner that for all of the switches of the same row, the input terminal is coupled to the first output terminal or is coupled to the second output terminal depending on binary control states;

each of the $2^P$ first output terminals and each of the $2^P$ second output terminals being coupled to a respective one of a plurality of switching input or output terminals, and the first and second output terminals of the ith row being coupled to the input terminals of the switches of the (i+1)th row in such a manner that for each combination of binary control states of the control means of the rows of switches, the pair of external terminals of said switching assembly can be coupled to any one single pair of the plurality of switching input or output terminals.

6. A switching assembly according to claim 5, wherein each of the plurality of switching input or output terminals is adapted and arranged to interface interchangeably with circuitry external to the switching assembly.

* * * * *